United States Patent
Park et al.

(10) Patent No.: US 9,029,271 B2
(45) Date of Patent: May 12, 2015

(54) METHODS OF PATTERNING BLOCK COPOLYMER LAYERS

(71) Applicant: Samsung Electronics Co., Ltd., Suwon-si, Gyeonggi-do (KR)

(72) Inventors: Youn Jung Park, Seoul (KR); Haeng Deog Koh, Hwaseong-si (KR); Mi-Jeong Kim, Hwaseong-si (KR); Seong-Jun Jeong, Ulsan-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/139,986

(22) Filed: Dec. 24, 2013

(65) Prior Publication Data

US 2014/0187054 A1 Jul. 3, 2014

(30) Foreign Application Priority Data

Dec. 31, 2012 (KR) .................... 10-2012-0158701

(51) Int. Cl.
*H01L 21/31* (2006.01)
*H01L 21/02* (2006.01)
*H01L 21/027* (2006.01)

(52) U.S. Cl.
CPC .... *H01L 21/02118* (2013.01); *H01L 21/02356* (2013.01); *H01L 21/027* (2013.01)

(58) Field of Classification Search
CPC .............. H01L 21/027; H01L 21/0271; H01L 21/0273; H01L 21/0276
USPC .......................... 438/780, 781, 700, 702, 424
See application file for complete search history.

(56) References Cited

U.S. PATENT DOCUMENTS

| 7,347,953 | B2 |   | 3/2008 | Black et al. |
| 7,785,937 | B2 | * | 8/2010 | Kim et al. ..................... 438/132 |
| 7,820,270 | B2 |   | 10/2010 | Black et al. |
| 7,846,502 | B2 |   | 12/2010 | Kim et al. |
| 8,097,175 | B2 | * | 1/2012 | Millward et al. ............... 216/17 |
| 8,114,301 | B2 | * | 2/2012 | Millward et al. ................ 216/2 |

OTHER PUBLICATIONS

Charles T. Black, "Nanometer-Scale Pattern Registration and Alignment by Directed Diblock Copolymer Self-Assembly", IEEE Transactions on Nanotechnology, vol. 3, No. 3, Sep. 2004, pp. 412-415.
Detcheverry et al., "Directed Assembly of a Cylinder-Forming Diblock Copolymer: Topographic and Chemical Patterns", Macromolecules, vol. 43, 2010, pp. 6495-6504.

(Continued)

*Primary Examiner* — Kevin M Picardat
(74) *Attorney, Agent, or Firm* — Cantor Colburn LLP

(57) ABSTRACT

A method of patterning a block copolymer layer includes: providing a guide pattern on a surface of a substrate, the guide pattern including sidewalls each elongated in a longitudinal direction and spaced apart from each other, a trench defined by a bottom surface and facing surfaces of the sidewalls, and having a uniform width over an entire length thereof in the longitudinal direction, and a latitudinal wall perpendicular to the longitudinal direction of the trench; providing a block copolymer layer on the surface of the substrate; and annealing the block copolymer to cause self-assembly of the block copolymer and to direct the same in the trench. The block copolymer has a microphase-separation into anisotropic discrete domains aligned with a period $\lambda_o$ in the trench by the annealing.

14 Claims, 10 Drawing Sheets

(56) References Cited

OTHER PUBLICATIONS

Ramanathan et al., "Materials self-assembly and fabrication in confined spaces", Journal of Materials Chemistry, vol. 22, 2012, pp. 10389-10405.

Tavakoli K.G. et al., "Templating Three-Dimensional Self-Assembled Structures in Bilayer Block Copolymer Films", Science, vol. 336, Jun. 8, 2012, pp. 1294-1298.

Tiron et al., "Optimization of block copolymer self-assembly through graphoepitaxy: A defectivity study", J. Vac. Sci. Technol., B29(6), Nov./Dec. 2011, pp. 06F206-1-06F206-8.

Xiao et al., "Graphoepitaxial cylindrical block copolymer nanodomains evaluated as bit patterned media template", J. Vac. Sci. Technol., B 25(6), Nov./Dec. 2007, pp. 1953-1957.

* cited by examiner (A)            (B)

(A) 
(B) 
(C) 
(D)

(A)

(B)

METHODS OF PATTERNING BLOCK COPOLYMER LAYERS

CROSS-REFERENCE TO RELATED APPLICATIONS

This application claims priority to Korean Patent Application No. 10-2012-0158701 filed on Dec. 31, 2012, and all the benefits accruing therefrom under 35 U.S.C. §119, the entire contents of which are incorporated herein by reference.

BACKGROUND

1. Field

Provided is a method of patterning a block copolymer layer.

2. Description of the Related Art

Demands for lithography technology for forming a fine nano-sized pattern of a semiconductor memory or a logic circuit have increased in accordance with a decrease in a size of electronic devices including the semiconductor memory or the logic circuit, and an increase in a degree to which semiconductor devices have been integrated in electronic devices.

Conventional photolithography technology has difficulties in realizing a fine nano-sized pattern. In particular, a nano-pattern of less than or equal to about 20 nanometers (nm) are difficult to manufacture, due to a wavelength resolution limit. Accordingly, various methods based on new principles have been developed for fabricating nano-sized patterns. An example of such a new principle is a method of fabricating a nano-sized pattern by utilizing a self-assembled nano-structure of block copolymer.

SUMMARY

One or more exemplary embodiment of the present invention provides a method of forming a pattern of nano-structure via self-assembly of a block copolymer without a dewetting phenomenon.

According to one embodiment, a method of patterning a block copolymer layer includes: providing a guide pattern on a surface of a substrate, the guide pattern including sidewalls each elongated in a longitudinal direction and spaced apart from each other, a trench defined by the surface of the substrate and facing surfaces of the sidewalls, and having a uniform width over an entire length thereof in the longitudinal direction, and a latitudinal wall perpendicular to the longitudinal direction of the trench; providing a block copolymer layer on the surface of the substrate; and annealing the block copolymer to cause a self-assembly of the block copolymer and to direct the same in the trench. The block copolymer has microphase-separation into anisotropic discrete domains aligned with a period $\lambda_o$ in the trench by the annealing.

The latitudinal wall may be spaced apart from the end of the trench by a distance less than or equal to about 10 micrometers (μm).

The latitudinal wall may be in contact with an end of the sidewalls, and the trench may be further defined by an inner surface of the latitudinal wall.

The anisotropic discrete domains are repeated with the period $\lambda_o$, and a depth of the trench may range from about $0.25\lambda_o$ to about $3\lambda_o$.

A height of the latitudinal wall may be greater than or equal to a depth of the trench.

The block copolymer may include a first polymer component and a second polymer component, and the first and second polymer components may be immiscible with each other.

A molecular weight ratio between the first and second polymer components may range from about 40:60 to about 60:40, and the anisotropic discrete domains may form a lamella structure being vertically oriented to the surface of the substrate.

A molecular weight ratio between the first and second polymer components may range from about 20:80 to about 39:61, and the anisotropic discrete domains may form a cylindrical structure being vertically or horizontally oriented to the surface of the substrate.

The annealing may include thermal annealing under a vacuum or in an inert atmosphere, solvent vapor-assisted annealing, or supercritical fluid-assisted annealing.

The patterning method may further include selectively removing a portion of the discrete domains of the block copolymer.

In one or more embodiment of the present invention, by controlling the edge structure of the topographic guide pattern, uniformity of a thin film in post-treatment processes may be secured. By way of an example, the dewetting phenomenon may be minimized even in a thin film having a thickness of less than or equal to about 40 nanometers (nm), and thereby an increased pattern area of the self-assembled structure of a block copolymer directed by the guide pattern is obtained. In addition, minimizing the dewetting phenomenon may improve the degree of pattern alignment, decrease the density of defects, and enable free control over the time of post-treatment processes.

BRIEF DESCRIPTION OF THE DRAWINGS

The above and other features of this disclosure will become more apparent by describing in further detail embodiments thereof with reference to the accompanying drawings, in which.

DETAILED DESCRIPTION

Figure 1:
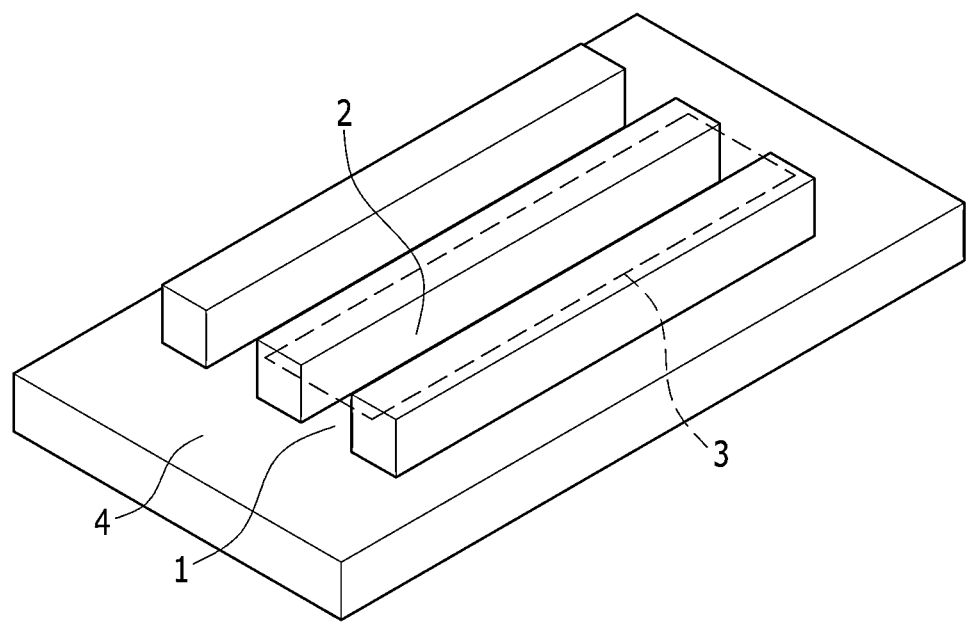
FIG. 1 is a perspective view illustrating a conventional topographic guide pattern having no latitudinal wall.

Advantages and characteristics of the present invention and a method for achieving the same will become evident referring to the following exemplary embodiments together with the drawings attached hereto. However, this disclosure may be embodied in many different forms and is not be construed as limited to the embodiments set forth herein; rather, these embodiments are provided so that this disclosure will satisfy applicable legal requirements. Therefore, in some embodiments, well-known process technologies are not explained in detail in order to avoid vague interpretation of the present invention.

It will be understood that when an element or layer is referred to as being "on," "connected to" or "coupled to" another element or layer, the element or layer can be directly on, connected or coupled to another element or layer or intervening elements or layers. In contrast, when an element is referred to as being "directly on," "directly connected to" or "directly coupled to" another element or layer, there are no intervening elements or layers present. As used herein, connected may refer to elements being physically and/or electrically connected to each other. Like numbers refer to like elements throughout. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the invention.

Spatially relative terms, such as "lower," "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise mentioned, all terms in the specification (including technical and scientific terms) may be commonly understood by one skilled in the art pertaining by the present invention. Terms defined in a generally-used dictionary are not to be interpreted ideally or exaggeratedly unless clearly defined. In addition, unless explicitly described to the contrary, the word "comprise" and variations such as "comprises" or "comprising" will be understood to imply the inclusion of stated elements but not the exclusion of any other elements.

The singular includes the plural unless specifically stated otherwise. As used herein, the singular forms "a," "an" and "the" are intended to include the plural forms as well, unless the context clearly indicates otherwise.

All methods described herein can be performed in a suitable order unless otherwise indicated herein or otherwise clearly contradicted by context. The use of any and all examples, or exemplary language (e.g., "such as"), is intended merely to better illustrate the invention and does not pose a limitation on the scope of the invention unless otherwise claimed. No language in the specification should be construed as indicating any non-claimed element as essential to the practice of the invention as used herein.

As used herein, "a period of the anisotropic discrete domains" indicates a distance between the repeating anisotropic discrete domains. Specifically, when the discrete domains form a cylindrical structure, the distance between the cylinders in a hexagonal array is a period of the discrete domains. When the discrete domains form an ABAB lamella structure, the sum of the thicknesses of the A and B layers is a period of the discrete domains.

As used herein, the term "topography pattern" refers to a pattern including trenches and mesas repeating with a period.

As used herein, the term "neutral surface for the first and second polymer components" refers to a surface to which the first and second polymer components have substantially equivalent/similar surface tension (or affinity).

As used herein, the term "a preferential surface to the first polymer component (or the second polymer component)" refers to a surface whose surface energy to the first polymer component (or the second polymer component) is lower than its surface energy to the second polymer component (or the first polymer component) so that the first polymer component (or the second polymer component) may be preferentially in contact with the given surface (in other words, the first polymer component (or the second polymer component) may wet first the surface).

Block copolymer ("BCP") is a type of polymeric material that may be self-assembled to form nano-structures. In molecular structure, the BCP has chemically different polymer blocks connected to one another through a covalent bond. Such polymer blocks may be self-assembled to form various nano-sized structures such as a sphere, a cylinder and a lamella, repeating with a period of about 5 nanometers (nm) to about 50 nm. The BCP may form a nano-structure with a long range order through a parallel process. The resulting nano-structure of the BCP may be used as an easily-removable template, and thus has drawn attention as a promising nano-patterning technology for fabricating various next generation devices in information technology ("IT"), broadband technology ("BT"), and electronics technology ("ET") fields.

For nano-patterning, a BCP copolymer film formed (e.g., provided) on a substrate having a guide pattern thereon is annealed to form a self-assembled product, which is directed in a desired direction, providing a vertically-arranged lamella structure or a horizontally-arranged cylinder structure. These structures may be subjected to a selective etching and/or removing process to provide a line and/or space array, and the array thus prepared may be used as a mask and the like in a subsequent fabricating process.

In order to be used in a patterning process, the nano-structure formed from the BCP should be able to be aligned over a relatively large area without defects. In addition, as a pattern to be formed becomes finer, a cross-sectional thickness of the BCP film becomes smaller. However, such a thin film is prone to undergo a "dewetting" phenomenon, where a film is undesirably ruptured on a substrate to form a droplet, and this may lead to an increase in the number of defects occurring in the fine pattern. Therefore, there remains a need for an improved process or method for fabricating a nano-structure or nano-pattern.

Hereinafter, the invention will be described in detail with reference to the accompanying drawings.

According to one or more embodiment of the present invention, a method of patterning a BCP layer is provided. The method includes providing a substrate having a surface with a guide pattern thereon; forming (e.g., providing) a BCP on the surface of the substrate; and annealing the BCP to cause self-assembly of the BCP and to direct the same in the trench. The BCP has microphase-separation into anisotropic discrete domains aligned with a period $\lambda_o$ in the trench by the annealing. The guide pattern includes a trench 3 defined by a bottom surface 1 of the substrate and facing surfaces of opposing sidewalls 2, and a latitudinal wall 5 disposed vertically with respect to the lengthwise (e.g., longitudinal) direction of the trench 3. The trench 3 lengthwise extends in a first direction, and has a substantially uniform width taken in a second direction perpendicular to the length and over an entire length thereof.

Figure 2:
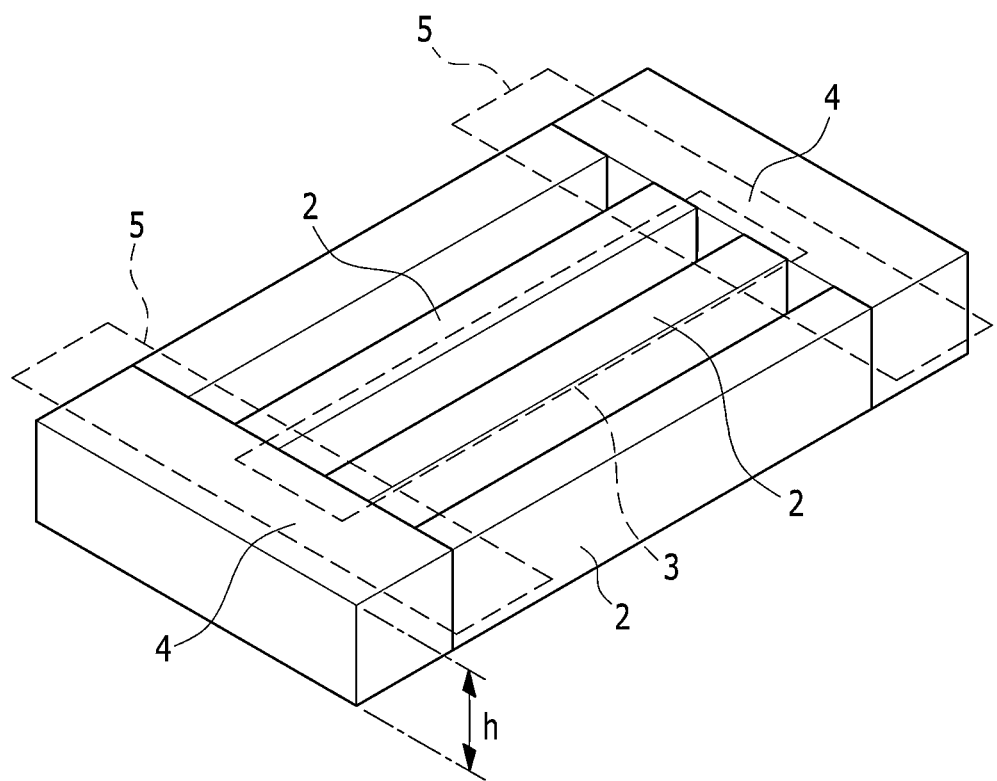
FIG. 2 is a perspective view illustrating a guide pattern that may be used according to an embodiment of the present invention.
Figure 3:
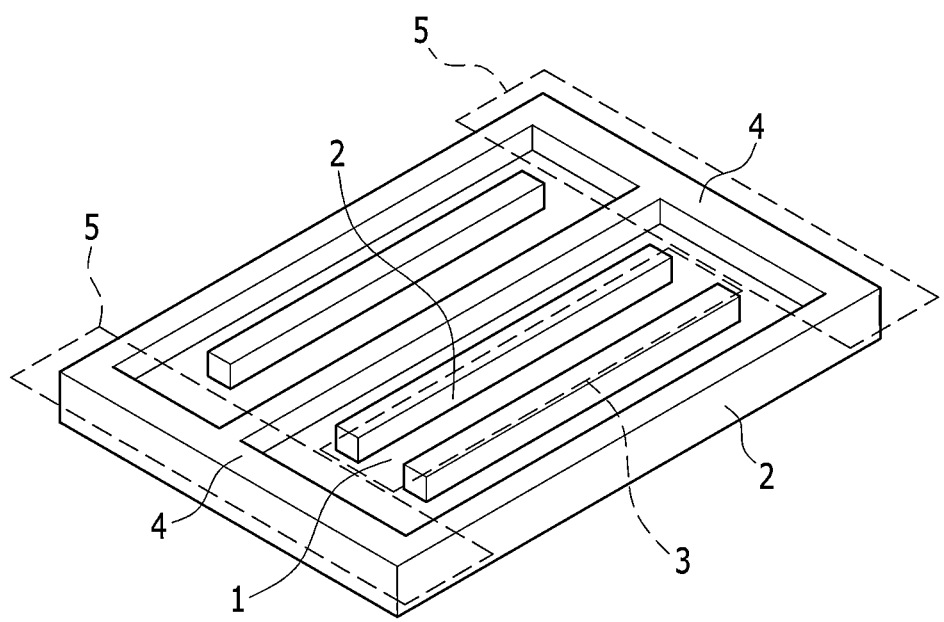
FIG. 3 is a perspective view illustrating a guide pattern that may be used according to another embodiment of the present invention.

The latitudinal wall 5 is disposed apart from the trench 3 by less than or equal to about 10 micrometers (μm), and specifically, less than or equal to about 6 μm, taken from a longitudinal end of the trench 3 (see FIG. 3). Alternatively, the latitudinal wall 5 may be in contact with the sidewall 2 to thereby further define the trench 3, and thus the trench 3 has a closed end by the latitudinal wall 5 (see FIG. 2). The end of the trench 3 may be defined by an end of the sidewall 2 and/or the latitudinal wall 5, but not being limited thereto or thereby.

Where the latitudinal wall 5 is in contact with the end of the sidewall 2 and effectively the trench 3, as shown in FIG. 2, the sidewalls 2 may connect opposing latitudinal walls 5 to each other. Inner sidewalls 2 of the guide pattern may have a thickness the same as a height of the latitudinal wall and/or an overall thickness of the substrate, but not being limited thereto or thereby. The inner sidewalls 2 may protrude from a bottom surface 1 (not indicated in FIG. 2), to define a depth of the trenches 3 less than a height of the latitudinal wall 5 and/or the overall thickness of the substrate.

Where the latitudinal wall 5 is spaced apart from the trench 3, the guide pattern may include a plurality of sidewalls 2. Referring to FIG. 3, for example, first sidewalls 2 may be spaced apart from opposing latitudinal walls 5, while second sidewalls 2 connect the opposing latitudinal walls 5 to each other. Inner sidewalls 2 may protrude from a bottom surface 1, to define a depth of the trenches 3 less than the overall thickness of the substrate.

As shown in FIG. 1, in a conventional guide pattern having no latitudinal wall, a dewetting phenomenon may occur when a thin film of a BCP layer formed on a substrate is subjected to an annealing process to bring about directed self-assembly of the BCP. Such dewetting phenomenon may lead to film loss at the end of the trench and hinder the direction of the BCP self-assembly by the guide pattern, thus resulting in pattern defects in the middle of the trench. Forming a thinner pattern often requires using a BCP of a lower molecular weight, and the BCP having such a low molecular weight tends to show high fluidity and thus form a thinner layer on the substrate. As a result, the dewetting phenomenon in the BCP layer may become more serious during a subsequent treating process, e.g., the annealing. In particular, when the lower molecular weight BCP is used, each of the polymer components constituting the BCP is required to have a significantly different solubility parameter from each other so as to bring forth a phase separation and thus to form discrete domains such as a cylinder, a lamella or the like. However, the dewetting phenomenon may become more serious when the polymer components of the BCP have a significantly different solubility parameter, leading to a noticeable increase in the number of defects in the pattern formed therefrom.

In a patterning method according to one embodiment of the present invention using a topographic guide pattern, the dewetting phenomenon and the defect occurrence may be reduced or effectively suppressed by disposing a latitudinal wall, which is either adjacent to the trench end or spaced a predetermined distance apart therefrom, vertically to the longitudinal direction of the trench. In other words, when a topographic guide pattern is used to direct a BCP self-assembly and form a line pattern of several to tens of nanometers, the latitudinal wall perpendicular to the trench of the guide pattern is provided to improve stability of the thin BCP layer during the heat treatment for self-assembly and to minimize the dewetting phenomenon. When the BCP film is annealed with enhanced film stability to direct microphase-separation, the line/space pattern formed therefrom may show a decreased level of defect density.

Referring to FIGS. 2 and 3 as non-limiting embodiments, a topographic guide pattern as shown in FIG. 2 and FIG. 3 includes a trench 3 defined by a bottom surface 1 and facing surfaces of opposing sidewalls 2. The trench 3 has a uniform width over an entire length thereof. Compared with the guide pattern in FIG. 1, the guide pattern in FIGS. 2 and 3 further include a latitudinal wall 5 vertically disposed with respect to the longitudinal direction of the trench 3.

As shown in FIG. 1, when a BCP layer is provided on a guide pattern including no latitudinal wall and is annealed, an undesirable dewetting phenomenon starts to occur from the flat area 4, such as at an edge of the substrate, and may easily spread into the trench 3 of the guide pattern. The dewetting is spread more inside the trench 3 as the annealing time becomes longer. The dewetting phenomenon spreading from an end of the guide pattern may lead to a decrease in the patterned area and may have an adverse effect on the direction of discrete domains in the middle of the guide pattern with no dewetting phenomenon, resulting in many defects.

In contrast, as shown in FIGS. 2 and 3, when being used for directing self-assembly of a BCP, the guide pattern including the latitudinal wall 5 makes it possible to suppress the occurrence of the dewetting phenomenon in the flat area 4 or to effectively prevent the same from spreading into the inside of the trench 3. Accordingly, loss of the patterned area and the number of the defects occurring in the middle of the trench 3 resulting from the dewetting of a trench 3 end section may be reduced or effectively prevented.

The guide pattern of FIG. 2 or 3 has a flat area 4, but the flat area 4 is placed at a position that is higher in a cross-sectional direction of the substrate than the bottom surface 1 of the guide pattern, by the trench depth (see FIG. 2). The flat area 4 may also have a width of less than or equal to about 10 μm in the length direction of the trench 3 and limited by dimensions of the latitudinal wall 5.

The presence of the latitudinal wall 5 may reduce or effectively prevent a spread of the dewetting phenomenon into the trench and/or to effectively suppress the dewetting phenomenon. The dewetting phenomenon occurs as the respective polymer chain in the BCP layer moves in order to be in a more stable state in terms of free energy. In addition, as shown in FIG. 2, when the latitudinal wall 5 is in contact with the end of the trench 3, the dewetting phenomenon occurring on the flat area 4 of the latitudinal wall may not spread into the trench 3 and thereby the dewetting phenomenon in the trench 3 may be reduced or effectively prevented.

As described above, the topographic guide pattern including the trench 3 defined therein, further includes the latitudinal wall 5 disposed to control an edge structure thereof, thereby making it possible to secure uniformity of a thin film in post-treatment processes such as annealing. In addition, the dewetting phenomenon may be minimized even in a thin film having a cross-sectional thickness of less than or equal to about 40 nm, and thereby it is possible to obtain an increased pattern area of the self-assembled structure of a BCP directed by the guide pattern. Furthermore, it is possible to increase the annealing time without concern of the effect of the dewetting phenomenon, thereby improving the degree of pattern alignment, and to minimize the number of defects.

The height of the latitudinal wall 5 (such as the height (h) in FIG. 2) is not particularly limited, but may be appropriately adjusted. In one embodiment, for example, the height of the latitudinal wall 5 may be greater than or equal to the depth of the trench 3.

The width and the depth of the trench 3 may be selected depending on the types and the shapes of a desired pattern, the types of a BCP being used, a period, a thickness and the like. The trench 3 may have a width of about $1\lambda_o$ to about $50\lambda_o$, and specifically, about $1\lambda_o$ to about $30\lambda_o$ (where $\lambda_o$ is the period of discrete domains formed by self-assembly of the BCP). The depth of the trench may be selected in light of the desired thickness of the BCP layer and/or the types of a BCP being used, a period and a thickness. The depth of the trench may range from about $0.25\lambda_o$ to about $3\lambda_o$, and specifically, from about $0.5\lambda_o$ to about $1.5\lambda_o$. In one embodiment, for example, the depth of the trench may be about 5 nm to about 100 nm, and specifically, about 10 nm to about 40 nm. The period $\lambda_o$ of discrete domains formed by the self-assembly of a BCP may be in a range of about 5 nm to about 100 nm, and specifically, about 10 nm to about 50 nm, but is not limited thereto. The length of the trench 3 is not particularly limited, and the trench 3 may have a desired length.

As set forth in the above-described embodiments, the guide pattern having a latitudinal wall 5 enables efficient suppression of the spread of the dewetting into a trench 3 and thus may provide a line and/or space pattern without increasing defect density caused by the dewetting, even when a trench 3 having a depth of less than or equal to about $1\lambda_o$ is used.

The guide pattern including the latitudinal wall 5 and the trench 3 defined therein may be fabricated in any of a number of methods. Such patterning methods may be top-down patterning such as lithography, bottom-up assembly, or a combination thereof, and for example, X-ray lithography, extreme ultraviolet ("UV") lithography, electron beam lithography, photolithography, interference lithography, nanoimprint lithography, or the like may be used. By way of a non-limiting embodiment, the formation of the guide pattern may include obtaining a groove pattern of a square waveform profile with a predetermined depth by using interference lithography and ion etching. Alternatively, the topography patterning may include forming a pattern of a positive or negative photoresist through the exposure and development (and then carrying out an etching process using the formed pattern as a mask) to provide the trench 3 and the latitudinal wall 5.

In the patterning method, any of a number of types of substrates may be used as is suitable for the purposes described herein. In one embodiment, for example, the substrate may include a polymer, a metal (including alloys thereof), a metal oxide, a metal nitride, and the like in a semiconductor field, where the BCP may be used as a resist mask for an additional process. Specific examples of the substrate may include, but are not limited to, a metal such as silicon, copper, chromium, iron, aluminum, hafnium, gallium, and the like, an oxide or nitride thereof (e.g., silicon oxide, hafnium oxide, aluminum oxide, and silicon nitride), glass, polyethylene, polyethylene terephthalate, polyimide, and the like. The repeating period of the trench may be greater than the period ($\lambda_o$) of the anisotropic discrete domain.

Wetting characteristics of the bottom surface and the sidewall surfaces of the trench 3 may be different from each other, and may be selected depending on the shape of a desired discrete domain (e.g., a horizontal cylinder or a vertical lamella). In one embodiment, for example, when the BCP including first and second polymer components is used to form a vertical lamella structure in a trench, the trench may have a bottom surface that is neutral to the first and second polymer components, while sidewall surfaces are preferential to either of the first and second polymer components. Alternatively, when the BCP including the first and second polymer components is used to form a horizontal cylinder structure in a trench, the bottom surface and the sidewall surfaces of the trench may be preferential to either of the first and second polymer components.

In order to prepare a neutral surface, the surface may be provided with a neutral self-assembled mono-molecular layer or a neutral polymer brush layer thereon. Specific examples of the self-assembled monolayer may include a layer consisting of pentyltrichlorosilane (PETCS), phenyltrichlorosilane (PTCS), benzyltrichlorosilane (BZTCS), toyltrichlorosilane (TTCS), 2-[(trimethoxysilyl)ethyl]-2-pyridine (PYRTMS), 4-biphenylyltrimethoxysilane (BPTMS), octadecyltrichlorosilane (OTS), 1-naphthyltrimethoxysilane (NAPTMS), 1-{(trimethoxysilyl)methyl}naphthalene (NATMS), or (9-methylanthracenyl)trimethoxysilane (MANTMS). Specific examples of the neutral polymer brush layer may include a random copolymer consisting of a first polymer component and a second polymer component that constitute the BCP (e.g., poly(styrene-co-methyl-methacrylate) (P S-r-PMMA) when the self-assembly of a polystyrene-b-poly(methyl methacrylate) (PS-b-PMMA) BCP is used).

In order to prepare a preferential surface to the BCP consisting of the first and second polymer components, the surface may be provided with a polymer brush layer including a homopolymer of the first polymer component or a homopolymer of the second polymer component (e.g., a polystyrene modified to have a hydroxyl group in a benzene ring (PS—OH) or a polydimethyl siloxane layer). When a PS-b-PMMA is used as a BCP, a surface consisting of natural silicon oxide, silicon oxide, or silicon nitride may be preferential to a PMMA component.

As the BCP, it is possible to use any copolymer that may have microphase-separation by self-assembly, such as a BCP consisting of a first polymer component and a second polymer component that are immiscible with each other.

The examples of the BCP may include a BCP consisting of two types of polymer components including styrene or a derivative thereof as a repeating unit, a BCP consisting of a polymer component including at least one selected from a repeating unit of styrene and a derivative thereof and a polymer component including a repeating unit of (meth)acrylic acid ester, a BCP consisting of a polymer component including at least one selected from styrene or a derivative thereof as a repeating unit and a polymer component including siloxane or a derivative thereof as a repeating unit, a BCP consisting of a polymer component including at least one selected from styrene or a derivative thereof as a repeating unit and a polymer component including silane or a derivative thereof as a repeating unit, a BCP consisting of a polymer component including at least one selected from styrene or a derivative thereof as a repeating unit and a polymer component including an olefin monomer as a repeating unit, a BCP consisting of a polymer component including at least one selected from styrene or a derivative thereof as a repeating unit and a polymer component including alkylene oxide as a repeating unit, a BCP consisting of a polymer component including at least one selected from alkylene oxide as a repeating unit and a polymer component including an olefin monomer as a repeating unit, and a BCP consisting of a polymer component including at least one selected from alkylene oxide as a repeating unit and a polymer component including (meth) acrylic acid ester as a repeating unit. The BCP may include at least two polymer components. The BCP may be used alone or in combination of at least two types of the BCP.

Specific examples of the (meth)acrylic acid ester may include, but are not limited to, (meth)acrylic acid methyl, (meth)acrylic acid ethyl, (meth)acrylic acid propyl, (meth) acrylic acid cyclohexyl, (meth)acrylic acid octyl, (meth) acrylic acid hydroxyethyl, (meth)acrylic acid hydroxypropyl, (meth)acrylic acid benzyl, (meth)acrylic acid anthracene, (meth)acrylic acid glycidyl, (meth)acrylic acid 3,4-epoxycyclohexylmethane, and (meth)acrylic acid propyl trimethoxysilane.

Specific examples of the styrene derivative may include, but are not limited to, alpha methyl styrene, 2-methyl styrene, 3-methyl styrene, 4-methyl styrene, 4-t-butyl styrene, 4-n-octyl styrene, 2,4,6-trimethyl styrene, 4-methoxy styrene, 4-t-butoxy styrene, 4-hydroxy styrene, 4-nitrostyrene, 3-nitrostyrene, 4-chlorostyrene, 4-fluorostyrene, 4-acetoxyvinyl styrene, 4-vinylbenzyl chloride, 1-vinyl naphthalene, 4-vinylbiphenyl, 1-vinyl-2-pyrrolidone, 9-vinyl anthracene, and vinyl pyridine.

Specific examples of the siloxane derivative may include, but are not limited to, dimethyl siloxane, diethyl siloxane, diphenyl siloxane, and methylphenyl siloxane.

Specific examples of the alkylene oxide may include, but are not limited to, ethylene oxide, propylene oxide, and butylene oxide.

Specific examples of the BCP may include, but are not limited to, a polystyrene-polymethylmethacrylate block copolymer (PS-b-PMMA), a polystyrene-polymethylacrylate BCP, a polystyrene-polyethylmethacrylate BCP, a polystyrene-poly-t-butyl methacrylate BCP, a polystyrene-polymethacrylic acid BCP, a polystyrene-polybutoxymethacrylate BCP, a polystyrene-polyethylacrylate BCP, a polystyrene-polyacrylic acid BCP, a polystyrene-polybutadiene BCP (PS-b-PBD), a polystyrene-polyisoprene BCP (PS-b-PI), a polystyrene-polyethylenepropylene BCP (PS-b-PEP), a polystyrene-polydimethylsiloxane BCP (PS-b-PDMS), a polystyrene-polyethylene BCP (PS-b-PE), a polystyrene-polyvinylpyridine BCP (PS-b-P4VP), a polystyrene-polyethylene oxide BCP (PS-b-PEO), a polyethylene oxide-polyisoprene BCP (PEO-b-PI), a polyethylene oxide-polybutadiene BCP (PEO-b-PBD), a polyethylene oxide-polymethylmethacrylate BCP (PEO-b-PMMA), a polyethylene oxide-polyethyleneethylene BCP (PEO-b-PEE), a polystyrene-polyferrocyanyldimethylsilane BCP (PS-b-PFS), a polybutadiene-polyvinylpyridine BCP (PBD-b-PVP), a polyisoprene-polymethylmethacrylate BCP (PI-b-PMMA), and a poly2-vinylpyridine-polydimethylsiloxane BCP (P2VP-b-PDMS).

The shape of the discrete domains formed by self-assembly of the BCP may be determined depending on the molecular weight ratio between the polymer components constituting the BCP. In one embodiment, for example, when the BCP consists of the first and second polymer components that are immiscible with each other, the discrete domains formed by self-assembly may have a lamella pattern as the ratio between the first and the second polymer components ranges from about 40:60 to about 60:40, while the discrete domains formed through self-assembly may form a cylinder pattern as the ratio between the first and second polymer components ranges from about 20:80 to about 39:61.

The number averaged molecular weight of the BCP is not particularly limited, and it may range from about 5,000 to about 500,000, specifically, about 5,000 to about 300,000, more specifically, about 5,000 to about 100,000, and much more specifically, about 5,000 to about 50,000.

The BCP layer may have microphase-separation into a plurality of discrete domains by the annealing. In one embodiment, for example, an A-b-B copolymer layer may have microphase-separation into discrete domains formed of a polymer A (hereinafter referred to as $P_A$) and discrete domains formed of a polymer B (hereinafter referred to as $P_B$). As used herein, the term "annealing" refers to treating a BCP such that at least two polymer components constituting the BCP may undergo sufficient phase separation to form an aligned pattern defined by repeating structural units. In the aforementioned patterning method, the annealing of the BCP may be accomplished by thermal annealing (under a vacuum or in an inert atmosphere), solvent vapor-assisted annealing (at a temperature higher than or equal to room temperature), supercritical fluid-assisted annealing, or the like.

By way of a specific example, the thermal annealing may be performed at an appropriate temperature for an appropriate time depending on the BCP.

In one embodiment, for example, the thermal annealing may be performed at a temperature higher than or equal to the glass transition temperature of the BCP and lower than the thermal decomposition temperature. By way of a non-limiting example, the heat treatment may be performed at a temperature of about 150 degrees Celsius (° C.) to about 350° C. The time for thermal annealing is not particularly limited, and by way of an example, the thermal annealing may be performed for about 1 minute to about 3 to 4 days. Such thermal annealing allows the BCP to have microphase-separation.

The method may further include selectively removing a portion of discrete domains of the BCP. Among a plurality of the discrete domains, some discrete domains (e.g., $P_A$ or $P_B$) may be removed in an appropriately manner. The method of removing is not particularly limited, but it may be properly chosen depending on the components of the discrete domains. In one embodiment, for example, it is possible to use oxygen plasma, ozone treatment, UV radiation, thermal decomposition, chemical decomposition or a combination thereof.

As set forth in the above, one or more embodiment of the method of patterning a BCP layer may improve stability of the thin film during the annealing for microphase separation of the BCP, and thus minimize the dewetting phenomenon and prevent the dewetting from spreading into the trench. Accordingly, the BCP has improved thin film stability and may be annealed and microphase separate to provide a line and/or space pattern having a lower defect density.

Hereinafter, the one or more embodiment is illustrated in more detail with reference to examples. However, as these are only exemplary embodiments of the present invention, and the present invention is not limited thereto.

EXAMPLES

Example 1

(1) An 8-inch silicon wafer substrate is cleaned, and a positive photoresist is spin-coated at 2500 revolutions per minute (rpm) on the substrate and prebaked. The photoresist is exposed to light using a KrF scanner, and then baked and developed to prepare a photoresist pattern. By using the photoresist pattern as a mask, reactive ion etching is carried out to prepare a Si trench pattern having a trench and a latitudinal wall (trench width: 1000 nm, trench depth: 40 nm, trench length: 500 μm, and the height of the latitudinal wall: 40 nm) as shown in FIG. 2, and then the photoresist pattern is removed from therefrom.

Figure 5:
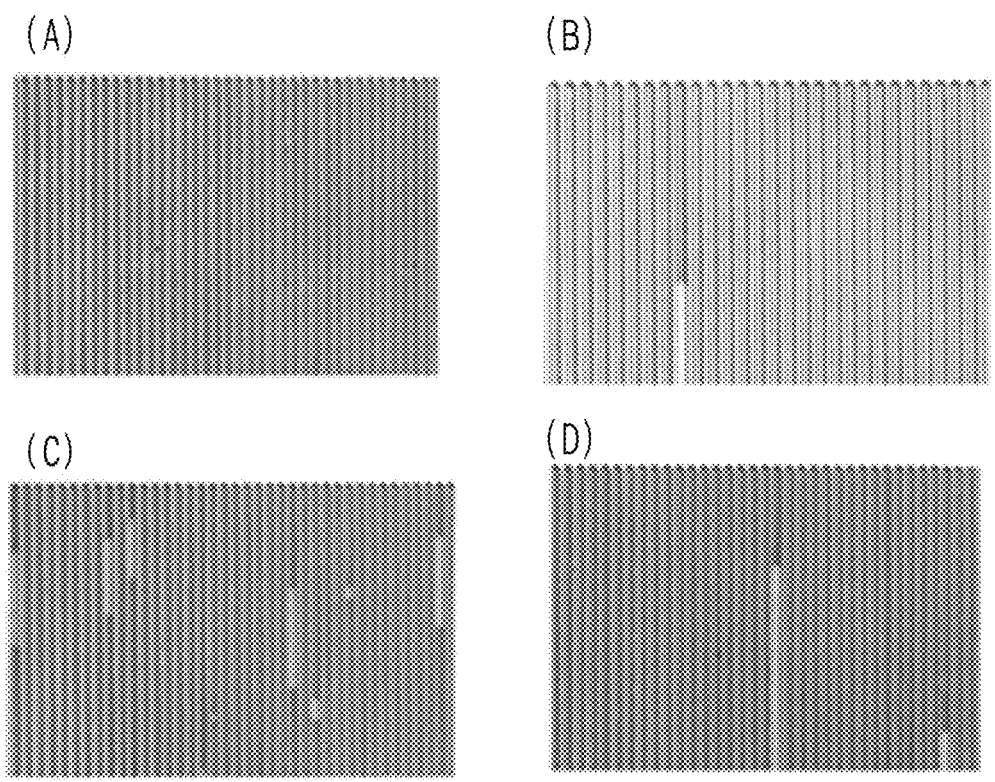
FIG. 5(A) to 5(D) are SEM images showing a substrate including a block copolymer layer annealed for different times in Example 1.
Figure 6:
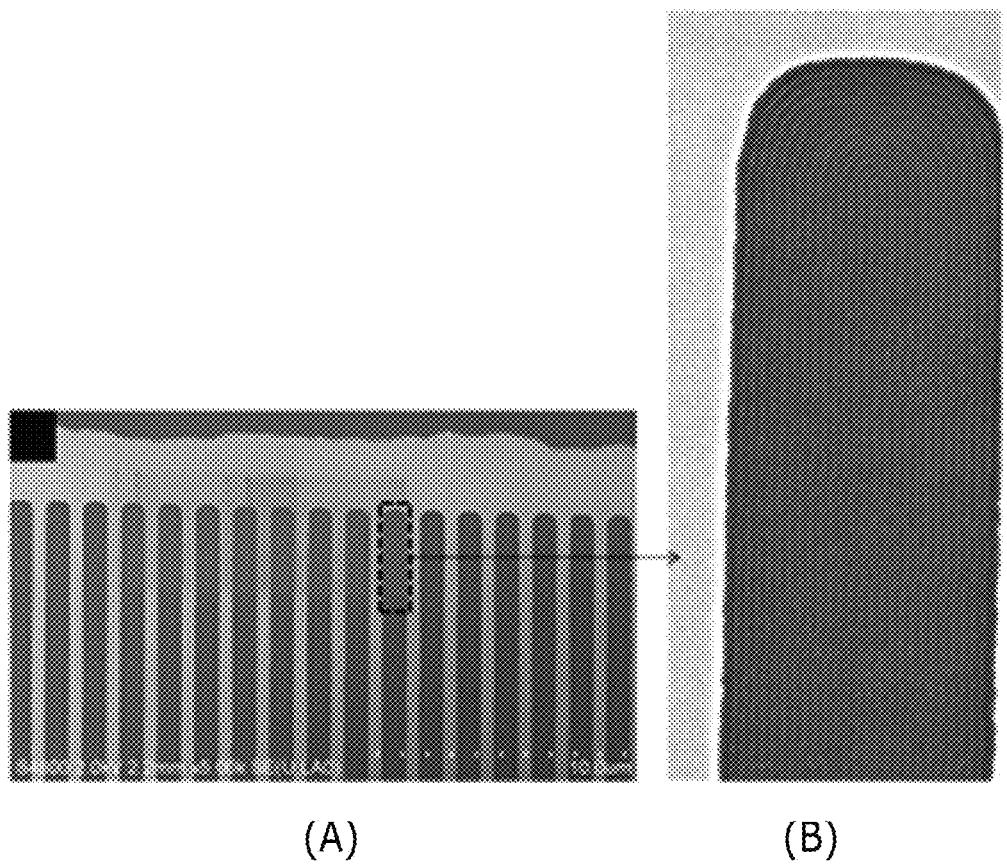
FIG. 6A shows a SEM image of a substrate including a block copolymer layer annealed for about 100 minutes in Example 1.
FIG. 6B shows an enlarged image of the substrate at an end section of a trench in the substrate.

(2) The Si trench pattern is cleaned with ultrasonic waves in acetone and exposed to UV ozone for 20 minutes. A polystyrene-b-polymethylmethacrylate (number average molecular weight: PS-b-PMMA 67k-21k, pattern period $\lambda_o$: 38 nm) solution (concentration: 0.8 wt %, solvent: toluene) is spin-coated on the cleaned Si trench pattern at 3000-4000 rpm for 60 seconds, forming a 32 nm ($0.8\lambda$)-thick BCP layer. The BCP layer is heat-treated at 280° C. for 5 minutes, 10 minutes, 60 minutes, and 180 minutes, respectively, to microphase separate into the polystyrene domains and the polymethylmethacrylate domains, providing a directed self-assembly patterns having a cylinder structure. For each of the patterns, the dewetting area is calculated in a flat area 4 and a trench 3. The results are provided in the following Table 1. In addition, FIG. 4 ((A) shows the flat area 4 and (B) shows the trench 3), and FIG. 5 and FIG. 6 show scanning electron microscope ("SEM") images of the patterns. FIG. 5(A) to 5(D) are SEM images showing a substrate including a block copolymer layer annealed for different times in Example 1. FIG. 6A shows a SEM image of a substrate including a block copolymer layer annealed for about 100 minutes in Example 1, and FIG. 6B shows an enlarged image of the substrate at an end section of a trench in the substrate. The SEM images are obtained by using a SEM (model: S-4700, manufactured by Hitachi Co., Ltd.).

(3) The number of defects is counted for the total area of 5.6 $\mu m^2$ and the total area of 148 $\mu m^2$. The results are provided in the following Table 2.

Example 2

Figure 7:
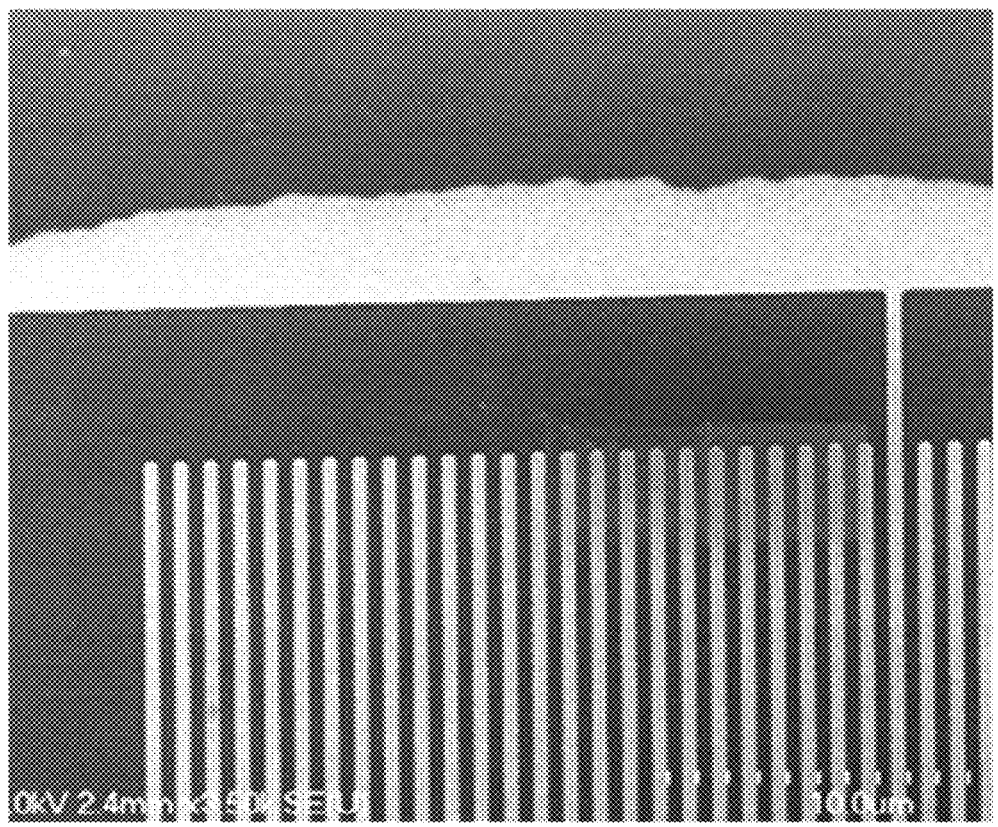
FIG. 7 is a SEM image of a substrate including a block copolymer layer annealed for about 100 minutes in Example 2.

A cylinder pattern is formed in the same manner as set forth in Example 1, except for using the Si trench pattern including a trench and a latitudinal wall shown in FIG. 3 (trench width: 500 nm, trench depth: 40 nm, trench length: 1 cm, latitudinal wall height: 40 nm, and distance spaced apart from the trench end: 6 μm) and annealing it for 100 minutes. For each of the patterns, the dewetting area is calculated in a flat area 4 and in a trench 3. The results are provided in the following Table 1. FIG. 7 shows SEM images of the patterns thus obtained. The SEM images are obtained by using a SEM (model: S-4700, manufactured by Hitachi Co., Ltd.).

Comparative Example 1

Figure 8:
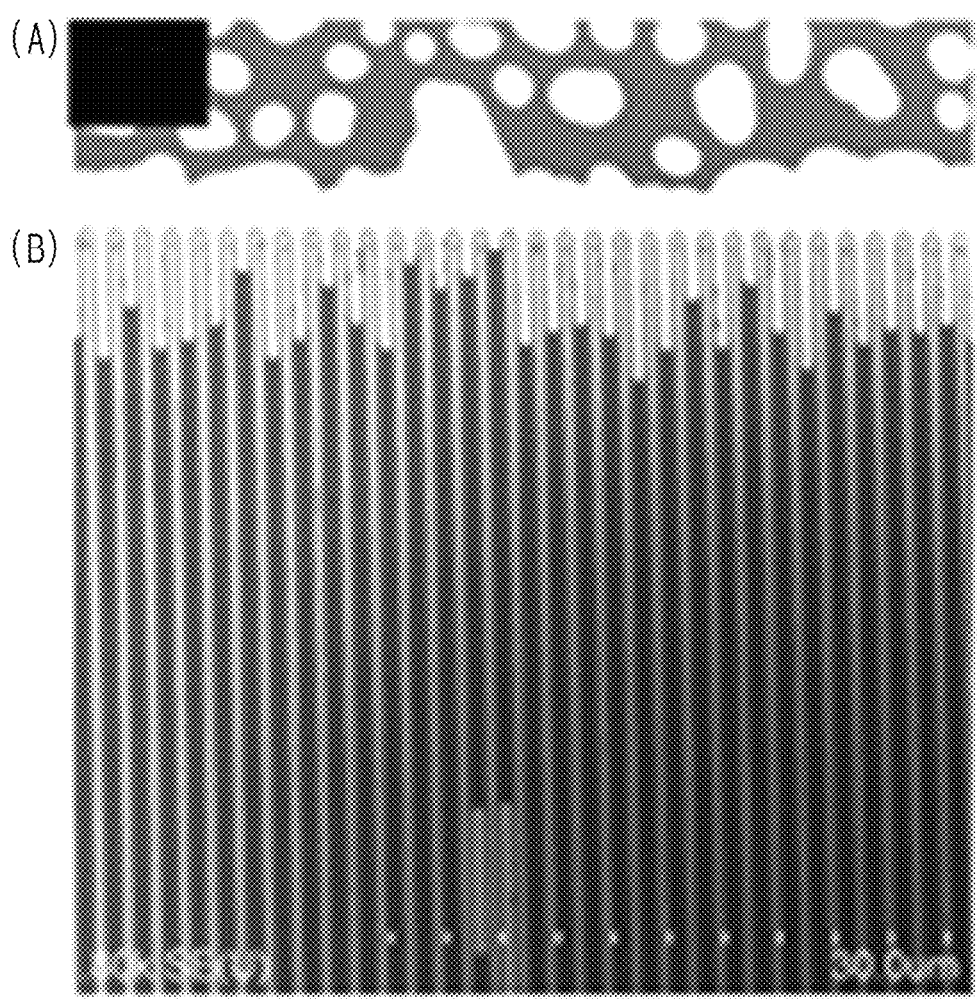
FIG. 8 is a SEM image of a substrate including a copolymer layer annealed for a predetermined time in Comparative Example 1.
Figure 9:
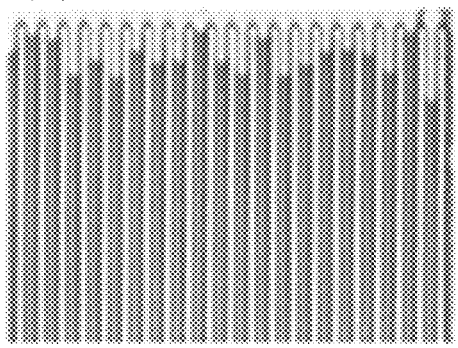
FIG. 9(A) to 9(D) are SEM images of a substrate including a block copolymer layer annealed while changing the time in Comparative Example 1.
Figure 9:
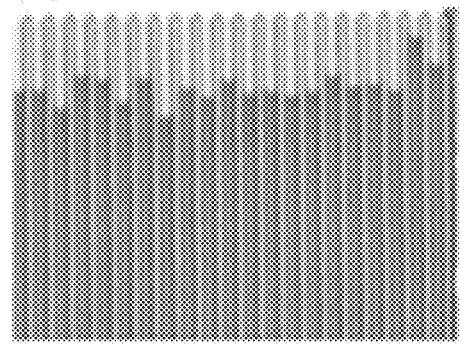
Figure 9:
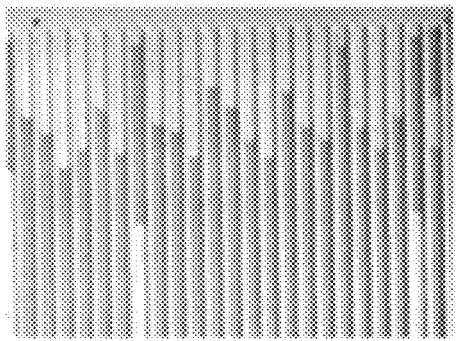
Figure 9:
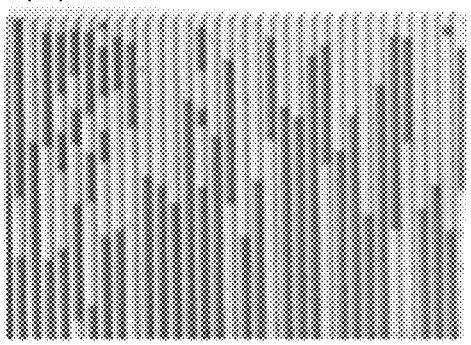
Figure 10:
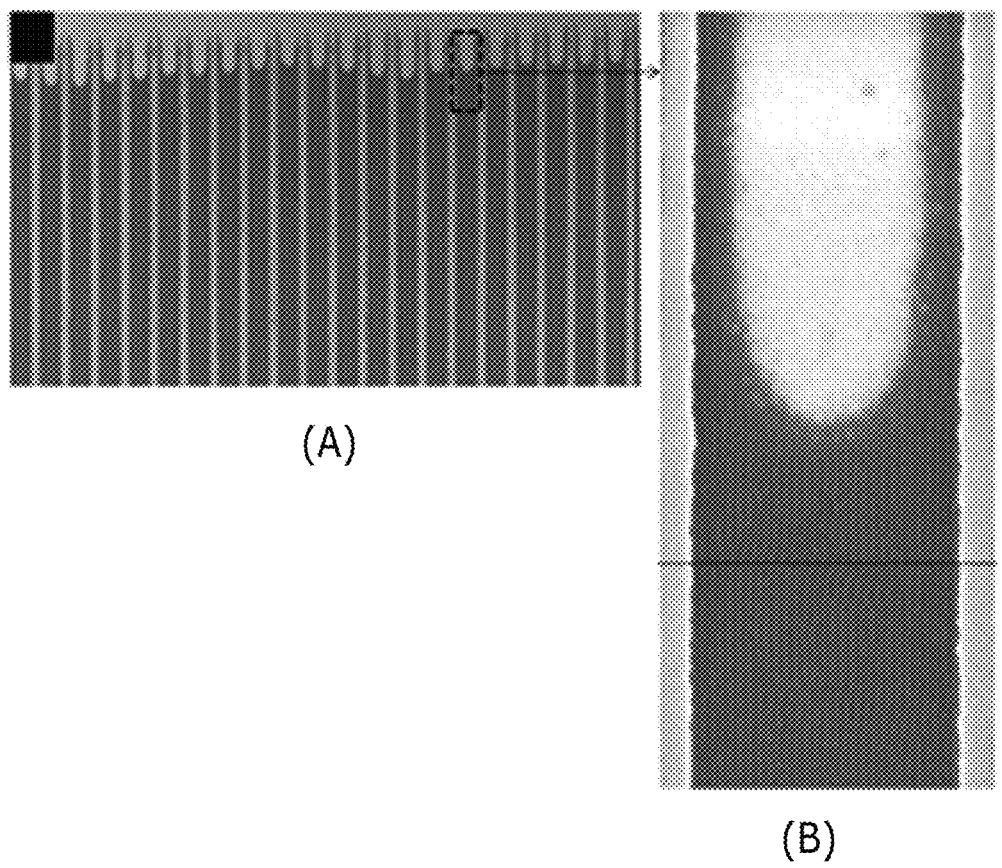
FIG. 10A is a SEM image of a substrate including a block copolymer layer annealed for about 100 minutes in Comparative Example 1.
FIG. 10B is an enlarged image of the substrate at an end section of a trench in the substrate.

(1) A cylinder pattern is formed according to the same method as Example 1, except for using a Si trench guide pattern including no latitudinal wall as shown in FIG. 1. FIG. 8 ((A) shows the flat area 4 and (B) shows the trench 3), and FIG. 9 and FIG. 10 show SEM images of the patterns. FIG. 9(A) to 9(D) are SEM images of a substrate including a block copolymer layer annealed while changing the time in Comparative Example 1. FIG. 10A is a SEM image of a substrate including a block copolymer layer annealed for about 100 minutes in Comparative Example 1, and FIG. 10B is an enlarged image of the substrate at an end section of a trench in the substrate. The SEM images are obtained by using a SEM (model: S-4700, manufactured by Hitachi Co., Ltd.).

(2) The number of defects is counted for the total area of 5.6 $\mu m^2$ and the total area of 148 $\mu m^2$. The results are provided in the following Table 2.

Figure 4:
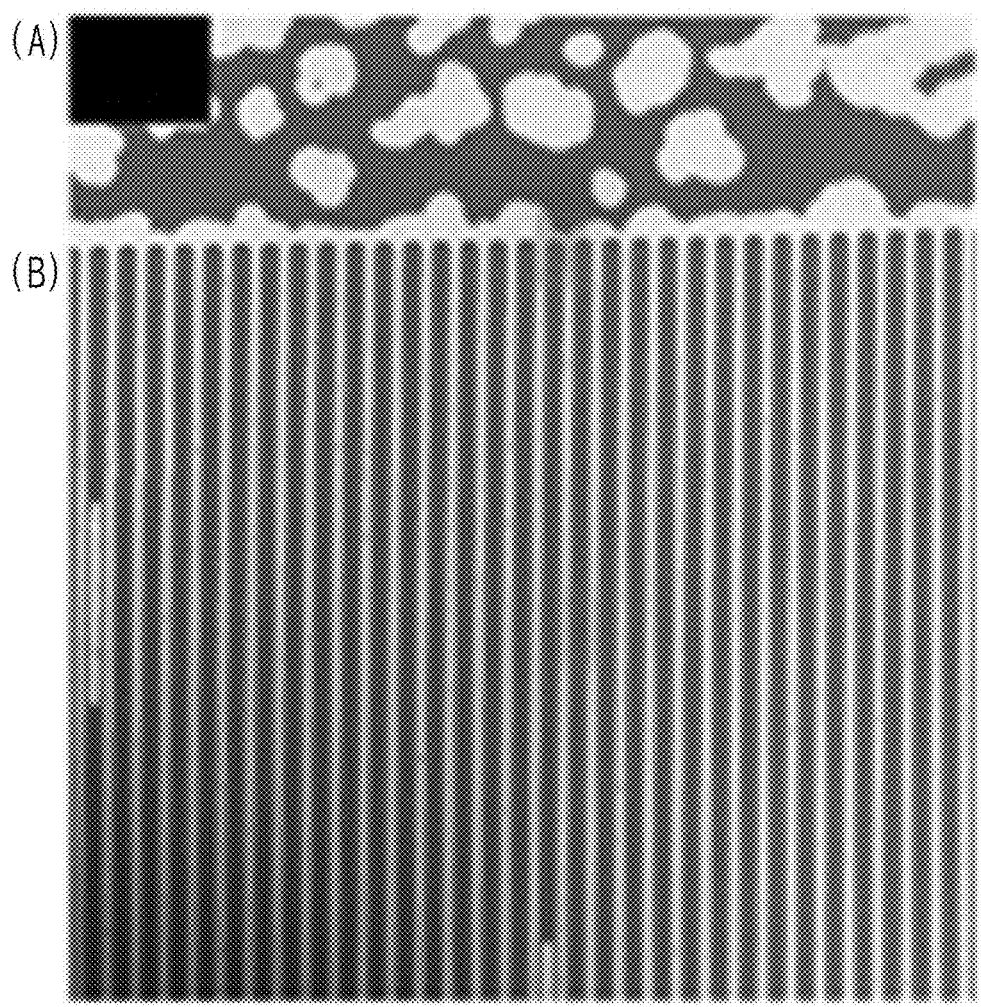
FIG. 4 is a scanning electron microscope ("SEM") image showing a substrate including a block copolymer layer annealed for a predetermined time in Example 1.

FIGS. 4 and 7 show that in the BCP patterns formed by using a guide pattern including a latitudinal wall 5 according to Examples 1 and 2, the dewetting phenomenon rarely occurs in the trenches 3. On the contrary, referring to FIG. 8, in the BCP patterns formed by using a guide pattern not including a latitudinal wall according to Comparative Example 1, the dewetting phenomenon is observed to spread from the flat area into the inside of the trenches 3.

FIGS. 5 and 9 show the changes occurring in the BCP layers prepared according to Example 1 and Comparative Example 1 when they annealed for a time of 5 minutes (A), 10 minutes (B), 60 minutes (C), and 180 minutes (D), respectively. For each BCP layer, the dewetting areas are calculated and the results are compiled in the following Table 1.

TABLE 1

| Annealing time (minute) | Dewetting area (%): Comparative Example 1 | | Dewetting area (%): Example 1 | |
|---|---|---|---|---|
| | Flat area | Inside trench | Flat area | Inside trench |
| (A) 5 | 46.9 | 13.6 | 45.8 | 0 |
| (B) 10 | 47.4 | 22.0 | 47.9 | 2.9 |
| (C) 60 | 50.4 | 44.7 | 48.0 | 3.9 |
| (D) 180 | 55.6 | 53.1 | 53.7 | 7.3 |

Referring to FIGS. 5 and 9 and Table 1, the BCP thin film of Example 1 that is prepared using a trench-type guide pattern including a latitudinal wall has a similar dewetting area in the flat area 4 to that of the BCP thin layer of Comparative Example 1 prepared by using a trench-type guide pattern including no latitudinal wall. However, in the case of the BCP thin layer according to Example 1, the dewetting area in the trench 3 is zero until the annealing time reaches 5 minutes, and even when the annealing time increases up to 10 minutes or longer, the dewetting area in the trench 3 is significantly smaller than the BCP pattern of Comparative Example 1. Accordingly, it is confirm that the thin film stability in the trench 3 is noticeably enhanced.

Referring to FIGS. 6 and 10, in the case of the BCP layer formed according to Example 1, substantially no dewetting is observed in the trench 3, while in the case of the BCP layer of Comparative Example 1, the dewetting spreads into the inside of the trench by annealing so that the thickness of the BCP thin film significantly changes in the trench, resulting in the defects such as dislocation.

The following Table 2 provides defect density of the BCP patterns prepared according to Example 1 and Comparative Example 1.

TABLE 2

| | Defect density in total area of 5.6 μm² (unit: count/cm²) | Defect density in total area of 148 μm² (unit: count/cm²) |
|---|---|---|
| Example 1 | $1.25 \times 10^8$ | $4.7 \times 10^6$ |
| Comparative Example 1 | $3.40 \times 10^8$ | $2.1 \times 10^8$ |

Referring to Table 2, the defect density for the pattern of Example 1 based on the total areas of 5.6 $\mu m^2$ and 148 $\mu m^2$ is 50 times smaller than that of the pattern of Comparative Example 1.

While this disclosure has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A method of patterning a block copolymer layer, comprising:
providing a guide pattern on a surface of a substrate, in a plan view, the guide pattern comprising:
sidewalls each elongated in a longitudinal direction and spaced apart from each other,
a trench defined by the surface of the substrate as a bottom surface and facing surfaces of the sidewalls, and having a uniform width over an entire length thereof in the longitudinal direction, and
a latitudinal wall elongated perpendicular to the longitudinal direction of the trench and facing opposing end surfaces of each of the sidewalls;
providing a block copolymer layer on the surface of the substrate; and
annealing the block copolymer to cause self-assembly of the block copolymer and to direct the same in the trench, wherein the block copolymer microphase-separates into anisotropic discrete domains aligned with a period $\lambda_o$ in the trench by the annealing.

2. The method of claim 1, wherein the latitudinal wall is spaced apart from the end of the trench by a distance less than or equal to about 10 micrometers.

3. The method of claim 1, wherein
the latitudinal wall contacts an end of the sidewalls, and
the trench is further defined by an inner surface of the latitudinal wall.

4. The method of claim 1, wherein
the anisotropic discrete domains have the period $\lambda_o$, and
the trench has a depth from about $0.25\lambda_o$ to about $3\lambda_o$.

5. The method of claim 1, wherein a height of the latitudinal wall is greater than or equal to a depth of the trench.

6. The method of claim 1, wherein the block copolymer comprises a first polymer component and a second polymer component, and the first and second polymer components are immiscible with each other.

7. The method of claim 6, wherein the block copolymer comprises a block copolymer consisting of two types of polymer components comprising styrene or a derivative thereof as repeating units, a block copolymer consisting of a polymer component comprising at least one selected from styrene or a derivative thereof as a repeating unit and a polymer component comprising (meth)acrylic acid ester as a repeating unit, a block copolymer consisting of a polymer component comprising at least one selected from styrene or a derivative thereof as a repeating unit and a polymer component comprising siloxane or a derivative thereof as a repeating unit, a block copolymer consisting of a polymer component comprising at least one selected from styrene or a derivative thereof as a repeating unit and a polymer component comprising silane or a derivative thereof as a repeating unit, a block copolymer consisting of a polymer component comprising at least one selected from styrene or a derivative thereof as a repeating unit and a polymer component comprising an olefin monomer as a repeating unit, a block copolymer consisting of a polymer component comprising at least one selected from styrene or a derivative thereof as a repeating unit and a polymer component comprising alkylene oxide as a repeating unit, a block copolymer consisting of a polymer component comprising at least one selected from alkylene oxide as a repeating unit and a polymer component comprising an olefin monomer as a repeating unit, and a block copolymer consisting of a polymer component comprising at least one selected from alkylene oxide as a repeating unit and a polymer component comprising (meth)acrylic acid ester as a repeating unit.

8. The method of claim 6, wherein
a molecular weight ratio between the first and second polymer components ranges from about 40:60 to about 60:40, and
the anisotropic discrete domains have a lamella structure vertically oriented to the surface of the substrate.

9. The method of claim 8, wherein
the bottom surface of the trench is neutral for the first and second polymer components, and
the facing surfaces of the sidewalls of the trench are preferential to either of the first polymeric component and the second polymer component.

10. The method of claim 6, wherein
a molecular weight ratio between the first and second polymer components ranges from about 20:80 to about 39:61, and
the anisotropic discrete domains have a cylindrical structure vertically or horizontally oriented to the surface of the substrate.

11. The method of claim 10, wherein the bottom surface and the facing surfaces of the sidewalls of the trench are preferential to either of the first polymer component and the second polymer component.

12. The method of claim 1, wherein the annealing comprises thermal annealing under a vacuum or in an inert atmosphere, solvent vapor-assisted annealing, or supercritical fluid-assisted annealing.

13. The method of claim 12, wherein the thermal annealing is performed at a temperature which is higher than or equal to a glass transition temperature of the block copolymer and lower than a decomposition temperature thereof, for about 5 minutes to about 100 hours.

14. The method of claim 1, further comprising selectively removing a portion of the discrete domains of the block copolymer.

* * * * *